United States Patent [19]

Mittelstädt

[11] Patent Number: 4,915,624
[45] Date of Patent: Apr. 10, 1990

[54] CONTINUOUS OVEN FOR SOLDERING ELECTRONIC COMPONENTS

[75] Inventor: Norbert Mittelstädt, Hanau, Fed. Rep. of Germany

[73] Assignee: Heraeus Quarzschmelze GmbH, Hanau, Fed. Rep. of Germany

[21] Appl. No.: 263,024

[22] Filed: Oct. 26, 1988

[30] Foreign Application Priority Data

Nov. 7, 1987 [DE] Fed. Rep. of Germany ....... 3738136

[51] Int. Cl.⁴ .................................................. F27B 9/28
[52] U.S. Cl. ...................................... 432/59; 432/128; 432/78
[58] Field of Search .................... 432/128, 121, 77, 78, 432/8, 59

[56] References Cited

U.S. PATENT DOCUMENTS

| | | | |
|---|---|---|---|
| 3,982,887 | 9/1976 | Kendziora et al. | 432/128 |
| 4,249,895 | 2/1981 | Mantegani | 432/78 |
| 4,627,814 | 12/1986 | Hattori et al. | 432/128 |
| 4,790,749 | 12/1988 | Mauro | 432/152 |

Primary Examiner—Henry C. Yuen
Attorney, Agent, or Firm—Felfe & Lynch

[57] ABSTRACT

Continuous ovens are known for soldering electronic components on circuit boards, with a conveyor belt having supports for the circuit boards, and having infrared radiators disposed in a spaced-apart relationship along the conveyor belt above and/or below the plane of belt movement, which are associated with at least one preheating zone and, following this zone in the direction of movement of the belt, with a soldering zone. To develop a continuous oven such that the temperatures between large and small components to be soldered on circuit board will be nearer one another in the soldering zone than in conventional ovens, a cooling zone is disposed between the preheating zone and the soldering zone, in which a forced cooling is performed with a gaseous coolant which is driven by a blower through nozzles disposed in the cooling zone substantially perpendicularly to the plane of the conveyor belt.

19 Claims, 1 Drawing Sheet

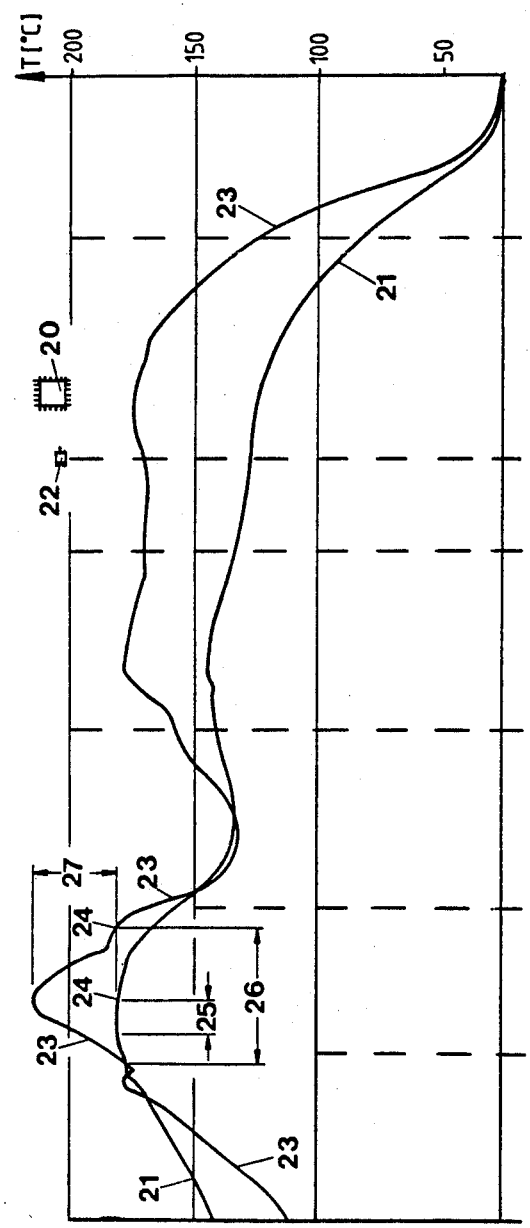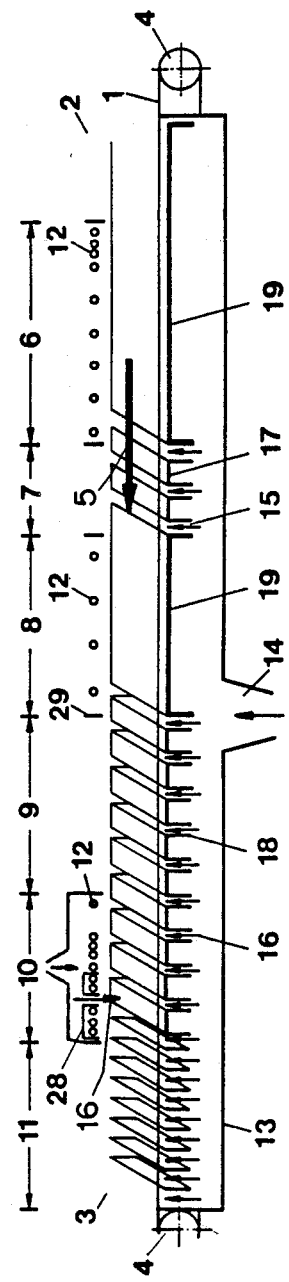

CONTINUOUS OVEN FOR SOLDERING ELECTRONIC COMPONENTS

The present invention relates to a continuous oven for soldering electronic components onto circuit boards, having a conveyor belt which has supports for the circuit boards, and infrared radiators disposed in a spaced-apart relationship along the conveyor belt above and/or below the plane of the moving belt, these radiators being associated with at least one preheating zone and, following this zone in the direction of belt movement, a soldering zone.

Such continuous ovens, which are also known as continuous infrared ovens for the surface mounting of SMD's (surface mounted devices), are generally known. For example, such an oven is known under the name, "Panasert-REF—Dual Side Heating Reflow Soldering and Curing Oven." These ovens have a conveyor belt on which the circuit boards are laid in order to carry them through the oven. Above and/or below this conveyor belt infrared radiators are disposed in the form of tubes or hot-plates for the purpose of soldering circuit boards provided with electronic components. The heating with the infrared radiators is divided into several heating zones which are operated at different powers so as to continually heat the solder to the temperature necessary for soldering the components.

Measurements made on components which ar to be soldered to the circuit boards have shown that large components warm up more slowly than small components which are only slightly above the circuit board and whose heat capacity is far lower on account of their small size. This can result in greater stress on the small components. In the soldering station this results in temperature differences between the casing of a large component, such as a PLCC 64 chip, and a transistor, amounting to 40° C to 45° C. As a result of these great temperature differences between the individual components, in the soldering zone small components become overheated and overstressed, while the large components reach a temperature slightly higher than the soldering temperature at their junctions; the temperature necessary for soldering with a lead-tin solder is approximately 180° C.

It is the purpose of the present invention to improve a continuous oven of the kind described above such that the temperature between large and small components being soldered onto a circuit board will be made more equal in the soldering area than in conventional ovens.

This purpose preferably is accomplished in a continuous oven of the kind described by disposing between the preheating zone and the soldering zone a cooling zone in which a positive cooling with a gaseous coolant is performed, which is driven by a blower through nozzles disposed in the cooling zone, in a direction substantially perpendicular to the plane of the conveyor belt. By this measure the circuit boards are positively cooled after the initial preheating before they enter into the soldering zone. The result of this cooling is that the small components on the circuit board cool more rapidly than the large components which, on account of their high heat capacity, are sometimes heated to a lower temperature. The small parts, which in the area ahead of the soldering zone are already at a temperature close to the soldering temperature, are brought closer in temperature to the large components before they enter the soldering zone. Measurements have shown that, as a result of this positive cooling, the large PLCC 64 chips and the small transistors (the measured PLCC 64 chips have about 400 times the mass of the transistors) can be brought virtually to an equal temperature ahead of the soldering zone. As a result of this temperature equalization ahead of the soldering zone the temperature approximation between the small components and the large ones is at least 10° C better than in conventional ovens, i.e., between these components a temperature difference of about 20 to 30° C is to be found. Due to this "temperature approximation," or reduction of temperature difference, the small components are subjected to less thermal stress and the total heating time is simultaneously reduced to a minimum, preferably to no more than 3.5 minutes depending on the mass of the component.

A slow temperature equalization during the preheating of the circuit boards can be promoted by providing several preheating zones ahead of the soldering zone, separated from one another by force-cooled zones. Between the individual preheatings the small components are always cooled more rapidly than the large components, so that the components heat up slowly in the individual preheating zones, but the temperature difference between the components of different size is kept slight. Preferably two preheating zones are provided, separated from one another by an additional cooling zone which is force-cooled.

Additional cooling in the soldering zone can be advantageous so as to prevent too great a temperature rise in the soldering zone. As a result of such force-cooling in the soldering zone the temperature gradient is flattened, so that the soldering temperature is approached over a longer range in which the soldering takes place and the temperature difference between large and small components is limited to a minimum.

Air is used preferably as the coolant, and is distributed through a manifold below and/or above the conveyor belt to the individual cooling zones and to the soldering zone. To achieve a directed flow the cooling air is blown through nozzles onto the conveyor belt and onto the circuit boards carried thereon. Quite simply such nozzles can be constituted by channel-like members disposed in a spaced-apart relationship, parallel to one another, transversely of the direction of movement of the conveyor belt. In the gaps between these channels a laminar flow of the cooling air is produced. A gap of 1 to 3 mm between the adjacent channels (nozzle gap) has proven to be advantageous. The height of the sides of the channels is preferably between 40 and 70 mm, and the average distance between adjacent nozzle openings or gaps is between 50 and 80 mm.

The described continuous oven, which has, for example, two preheating zones with one cooling zone between them, can be operated with conveyor belt velocities of from 0.6 m/min to 1 m/min, preferably of about 0.8 m/min. Especially at these velocities the energy densities of the infrared radiators in the first preheating zone should be about 3.5 to 4.5 W/cm$^2$, in the second preheating zone 2 about 3 W/cm$^2$ and in the soldering zone 5 to 6 W/cm$^2$. To be able to keep the soldering zone very short, medium and/or short wavelength infrared radiators are used preferentially in this area, which in comparison to long-wavelength infrared radiators are distinguished by a higher energy density.

An additional cooling zone following the soldering zone can serve to cool the components off sufficiently before they are taken from the continuous oven.

In the first and second cooling zones individual infrared radiators can be used which, if desired, are operated separately from the infrared radiators of the preheating zone so as to counteract excessively rapid cooling, also in relation to the components being soldered.

In accordance with the invention, a continuous oven for soldering electronic components on circuit boards comprises a conveyor belt having supports for the circuit boards. Along the conveyor belt, at least one of above and below the belt's plane of movement, infrared radiators are disposed in a spaced-apart relationship, which are associated with at least one preheating zone and, seen in the direction of belt movement, behind this zone with a soldering zone. The oven also includes a cooling zone disposed between the preheating zone and the soldering zone and nozzle means disposed in the cooling zone substantially perpendicularly to the plane of the conveyor belt for performing a forced cooling with a gaseous coolant.

For a better understanding of the invention, together with other and further objects thereof, reference is made to the following description, taken in connection with the accompanying drawings, and its scope will be pointed out in the appended claims.

Referring now to the drawings:

FIG. 1 is a diagrammatic longitudinal section through a continuous conveyor belt oven; and FIG. 2 shows the temperature profile of a PLCC 64 chip and a transistor during passage through the oven.

As can be seen in FIG. 1, the continuous oven has a conveyor belt 1 which passes over a roll 4 at the entrance and the exit from the oven. The oven is divided into six individual zones and, in the direction of belt movement, indicated by the arrow 5, it has a first preheating zone 6, a first quieting or cooling zone 7, next a second preheating zone 8, a second quieting or cooling zone 9, a soldering zone 10, and another cooling zone 11. The individual preheating zones 6 and 8 as well as the soldering zone 10 have elongated tubular infrared radiators 12 which are combined together in pairs if desired, the first preheating zone being equipped with a greater number of infrared radiators 12 than the second preheating zone 8, and the soldering zone having a larger number of infrared radiators 12 than the first preheating zone 6. The energy densities put out by the infrared radiators 12 amount in the first preheating zone 6 to about 4 W/cm$^2$, in the second preheating zone 8 about 2.5 W/cm$^2$, and in the soldering zone 10 about 5.5 W/cm$^2$.

While the infrared radiators 12 above the conveyor belt 1 are at a distance from the latter, no infrared radiators 12 are present in the area of the underside of the conveyor belt 1. With a continuous oven of this kind, circuit boards which are placed on the conveyor belt 1 are soldered, the junctions to be soldered being present on the side of the circuit boards facing the infrared radiators 12, while no soldering is performed on the underside. On the underside of the continuous over an air manifold 13 is present over its entire length to which cooling air is delivered by a blower which is not shown. The cooling air is distributed through the air manifold 13 over the entire length of the continuous oven, where it is directed by individual nozzles 15 against the underside of the conveyor belt 1 and thus against the bottom of the circuit boards, as is indicated by the arrows 16. The nozzles 15 are formed of metal between the channel sides 17 and are aligned parallel to one another and transversely of the direction of movement 5 of the conveyor belt 1 with their openings between the sides 18 pointing downward (the possibility also exists of arranging the nozzles with their opening pointing upward). The height of the sides 18 of the channels 17 amounts to 60 mm and the width of the openings of the nozzles 15 between adjacent sides 18 of two channels 17 amounts to 2 mm. The channels 17 are provided in the first quieting or cooling zone 7 and in the second quieting or cooling zone 9, while the first preheating zone 6 and the second preheating zone 8 beneath the conveyor belt 1 have each a continuous cover plate 19, so that in this area no cooling air can be blown against the moving circuit boards. In addition to the force-cooled first cooling zone 7 and the second cooling zone 9, additional channels 17 are inserted in the area of the soldering zone 10 after the second cooling zone 9 and they also direct cooling air against the conveyor belt 1 in the soldering zone 10.

Circuit boards which are placed onto the conveyor belt in the area of the entrance 2 to the continuous oven with their junctions pointing upward first enter the first preheating zone 6 where they are slowly heated up, as indicated in FIG. 2. The two curves in FIG. 2 represent the preheating curves of a PLCC 64 chip, indicated with the reference number 20 (curve 21), and of a substantially smaller transistor 22 (curve 23); the PLCC 64 chip as well as the transistor 22 are shown diagrammatically in plan to indicate their comparative sizes. The mass of the PLCC 64 chip (reference 20) is 400 times greater than the mass of the transistor 22, which has three terminal pins, while the measured PLCC 64 chip has sixteen terminal pins on each of four opposite sides. The heating curves 21 and 23 in FIG. 2 are directly associated with the continuous oven in accordance with FIG. 2.

Components 20 and 22 which are laid on the conveyor belt 1 at room temperature, heat up at different rates in the first preheating zone 6, the large PLCC 64 chip having at the end of the first preheating zone 6 a temperature of about 125° C in the area of a terminal pin to be soldered, while the very small transistor, in comparison to the PLCC 64 chip, already has a temperature of about 170° C, i.e., a temperature slightly below the lead-tin soldering temperature. The length of this first preheating zone 6 is around 535 mm, i.e., the time of stay in preheating zone 6 amounts to 40 seconds at a conveyor belt speed of about 0.8 m/min. After preheating zone 6, the circuit boards with the components to be soldered travel through the first cooling zone 7 in which cooling air flows between the channels 17 against the bottoms of the circuit boards. This forced air cools the circuit boards and the components thereon, while transistor 22 cools more quickly than the substantially larger PLCC 64 chip (reference 20) with a greater heat capacity corresponding to its greater mass, with the result that the heating curves 21 and 23, which are about 50° C apart at the beginning of the first cooling zone 7, are still about 35° C apart at the beginning of the second preheating zone 8. The temperatures of the different components are brought closer together by this first force-cooled zone 7. In the second preheating zone 8, the circuit boards and the components are further heated after the first cooling zone 7, until at the exit from the second preheating zone 8 they have temperatures of 180° C (curve 23, transistor 22) and 145° C (curve 21, PLCC 64 chip). The length of the first cooling zone 7 is 360 mm, the run-through time about 26 sec; the length of the second preheating zone 8 is 460 mm with a run-through time of 35 sec. The second preheating zone 8 is followed by the second cooling zone 9 with a length of 430 mm, and consequently a circuit board run-through time is about 32 sec. This second cooling zone 9 immediately ahead of the soldering zone 10 brings it about that all components are cooled, with the effect that the smaller components, as indicated by the curve 23 with which the transistor 22 is associated, cool more rapidly than the large components and the temperatures of these components of different heat capacity are equalized, being about 125° C in the present example.

In the soldering zone 10, into which the components now enter with the same temperature, the actual soldering process takes place, which begins at a temperature of about 180° C. In accordance with the different heat capacity of the components, this soldering process starts in the case of the small transistor 22 earlier than in the case of the large PLCC 64 chip; the reaching of the soldering temperature of 183° C is indicated at the points 24. The length of the soldering zone 10 is 610 mm, the run-through time about 45 sec. The time interval in which the PLCC 64 chip (reference 20) is at a soldering temperature, which is above 183° C, is indicated by the reference number 25, while the corresponding interval for the small transistor 22 is indicated by number 26. The temperature difference ΔT between the large and small components, indicated by the reference 27, amounts in the example to 31° C and can be still further reduced by optimization or by additional cooling from above, as will be explained below.

The soldering zone 10 is followed in conveyor belt direction 5 by an additional cooling zone 11 for the purpose of sufficiently cooling the circuit boards with the components for removal from the continuous oven. As the temperature curves show, the temperatures at the end of the oven are between 100° C and 135° C. The circuit boards are also force-cooled in this additional cooling zone 11. By the use of more intense cooling on both sides and/or by lengthening the cooling zone 11 the exit temperature can be still further reduced.

To prevent overheating the circuit boards in the soldering zone 10 and to provide controlled heating of the junctions of the individual components, the soldering zone 10 below the conveyor belt 1 is also equipped with force-cooling in the form of the previously described channels 17.

An additional equalization of the temperature curves of the different components can be achieved precisely in the soldering zone 10 by performing an additional cooling of the upper side, i.e., from the direction of the infrared radiators 12. For this purpose the infrared radiators 12 are inserted into the free spaces between the sides of the channels 28, which, in contrast to the channels 17 underneath the conveyor belt 1, are aimed at the conveyor belt. In FIG. 1, inverted U-shaped plates are represented only at one end of this soldering zone; if necessary they can be distributed over the entire soldering zone 10.

A forced cooling zone 11 preferably follows the soldering zone 10 in the direction of belt movement.

To define the two preheating zones 6 and 8 as well as the soldering zone 10, bulkheads 29 are inserted into the plane of the infrared radiators 12 to prevent lateral radiation.

While there has been described what is at present considered to be the preferred embodiment of this invention, it will be obvious to those skilled in the art that various changes and modifications may be made therein without departing from the invention, and t is, therefore, aimed to cover all such changes and modifications as fall within the true spirit and scope of the invention.

What is claimed is:

1. A continuous oven for soldering large and small electronic components on circuit boards, comprising:
    a conveyor belt having supports for the circuit boards;
    along the conveyor belt, at least one of above and below the belt's plane of movement, infrared radiators disposed in a spaced-apart relationship, which are associated with t least one preheating means and, seen in the direction of belt movement, behind this means, with a soldering means;
    cooling means disposed between the preheating means and the soldering means and disposed among the soldering means, and nozzle means disposed in the cooing means substantially perpendicularly to the plane of the conveyor belt for performing a forced cooling with a gaseous coolant, whereby small components are subjected to less thermal stress and total heating time is reduced.

2. A continuous oven in accordance with claim 1, in which said cooling means includes means for performing the cooling among the soldering means by a gaseous coolant at least from the side of the conveyor belt opposite the radiators.

3. A continuous oven for soldering large and small electronic components on circuit boards, comprising:
    a conveyor belt having supports for the circuit boards;
    along the conveyor belt, at least one of above and below the belt's plane of movement, infrared radiators disposed in a spaced-apart relationship, which are associated with at least one preheating means and, seen in the direction of belt movement, behind this means, with a soldering means;
    cooling means disposed between the preheating means the soldering means and nozzle means disposed in the cooling zone substantially perpendicularly to the plane of the conveyor belt for performing a forced cooling with a gaseous coolant, whereby small components are subjected to less thermal stress and total heating time is reduced.

4. A continuous oven in accordance with claim 3, which includes several preheating means and cooling means disposed in each case between individual preheating means.

5. A continuous oven in accordance with claim 4, which includes two preheating means.

6. A continuous oven in accordance with claim 3, in which the infrared radiators terminate ahead, as seen in the direction of belt movement, of the cooling means and continue after the cooling means in the area of the soldering means.

7. A continuous oven in accordance with claim 3, in which said nozzle means include nozzles defined by the space between adjacent inverted U-shaped profiles extending transversely to the conveyor belt.

8. A continuous oven in accordance with claim 7, in which a clear distance between adjacent sides of the U-shaped profiles amounts to 1 to 3 mm.

9. A continuous oven in accordance with claim 8, in which the length of the sides of the U-shaped profiles amounts to 40 to 70 mm.

10. A continuous oven in accordance with claim 7, in which an average spacing of adjacent nozzle openings amounts to 50 to 80 mm.

11. A continuous oven in accordance with claim 1, in which the conveyor belt operates at a run-through velocity of 0.6 m/min to 1 m/min.

12. A continuous oven in accordance with claim 11, in which the conveyor belt operates with a run-through velocity of about 0.8 m/min.

13. A continuous oven in accordance with claim 3, in which energy density in the first preheating means amounts to about 3.5 to 4.5 W/cm$^2$ and energy density in the soldering means to about 5 to 6 W/cm$^2$.

14. A continuous oven in accordance with claim 4, in which energy density in a second preheating means amounts to 2 to 3 W/cm$^2$.

15. A continuous oven in accordance with claim 3, which includes short-wavelength infrared radiators in the soldering means.

16. A continuous oven in accordance with claim 3, which includes a force-cooled cooling means following the soldering means in the direction of belt movement.

17. A continuous oven in accordance with claim 3, in which the cooling means between the preheating means and the soldering means has a length corresponding approximately to the length of the preheating means.

18. A continuous oven in accordance with claim 3, in which the cooling means has individual infrared radiators.

19. A method of soldering large and small electronic components on circuit boards in a continuous oven comprising:
supporting the circuit boards on a conveyor belt;
heating along the conveyor belt by infrared radiators disposed at least one of above and below the belt's plane of movement and disposed in a spaced-apart relationship and which are associated with at least one preheating zone and, seen in the direction of belt movement, behind this zone with a soldering zone; and
cooling the electronic components in a cooling zone disposed between the preheating zone and the soldering zone by utilizing nozzle means disposed in the cooling zone substantially perpendicularly to the plane of the conveyor belt for performing a forced cooling with a gaseous coolant, whereby small components are subjected to less thermal stress and total heating time is reduced.

* * * * *

UNITED STATES PATENT AND TRADEMARK OFFICE
CERTIFICATE OF CORRECTION

PATENT NO. : 4,915,624
DATED : April 10, 1990
INVENTOR(S) : Norbert Mittelstädt

It is certified that error appears in the above-identified patent and that said Letters Patent is hereby corrected as shown below:

Column 1, line 29 for "which ar"

read -- which are --.

Column 3, line 58 for "over an air"

read -- oven an air --.

Column 6, line 13 for "with t least"

read -- with at least --.

Column 6, line 19 for "cooing" read -- cooling --.

Column 7, line 4 for "1" read -- 3 --.

Signed and Sealed this

Fourth Day of February, 1992

Attest:

HARRY F. MANBECK, JR.

*Attesting Officer*      *Commissioner of Patents and Trademarks*